United States Patent
Buck et al.

(10) Patent No.: US 9,672,880 B2
(45) Date of Patent: Jun. 6, 2017

(54) RADIATION UPSET DETECTION

(71) Applicant: Honeywell International Inc., Morristown, NJ (US)

(72) Inventors: Timothy Merrill Buck, Oakdale, MN (US); Paris D. Wiley, Tampa, FL (US)

(73) Assignee: Honeywell International Inc., Morris Plains, NJ (US)

( * ) Notice: Subject to any disclaimer, the term of this patent is extended or adjusted under 35 U.S.C. 154(b) by 291 days.

(21) Appl. No.: 14/511,709

(22) Filed: Oct. 10, 2014

(65) Prior Publication Data

US 2015/0364216 A1 Dec. 17, 2015

Related U.S. Application Data

(60) Provisional application No. 62/012,905, filed on Jun. 16, 2014.

(51) Int. Cl.
*G11C 7/20* (2006.01)
*G11C 5/00* (2006.01)
*G11C 29/52* (2006.01)
*G11C 7/02* (2006.01)
*G11C 7/22* (2006.01)
*G11C 11/412* (2006.01)

(52) U.S. Cl.
CPC ............... *G11C 7/20* (2013.01); *G11C 5/005* (2013.01); *G11C 7/02* (2013.01); *G11C 29/52* (2013.01); *G11C 11/4125* (2013.01)

(58) Field of Classification Search
CPC .. G11C 7/20; G11C 5/005; G11C 7/02; G11C 29/52; G11C 11/4125
See application file for complete search history.

(56) References Cited

U.S. PATENT DOCUMENTS

| 5,604,755 | A | * | 2/1997 | Bertin | ................ | G06F 11/073 |
| | | | | | | 714/764 |
| 5,825,729 | A | * | 10/1998 | Ogasawara | ............ | G11B 7/09 |
| | | | | | | 369/44.27 |
| 6,388,259 | B1 | * | 5/2002 | Murdock | ................. | G01T 7/00 |
| | | | | | | 250/370.01 |

(Continued)

FOREIGN PATENT DOCUMENTS

CN 102169718 8/2011

*Primary Examiner* — April Y Blair
*Assistant Examiner* — Dipakkumar Gandhi
(74) *Attorney, Agent, or Firm* — Fogg & Powers LLC

(57) ABSTRACT

A radiation upset detector is provided. The radiation upset detector includes at least one radiation sensitive memory initialized with at least one respective known-signature word; and at least one radiation hardened logic circuitry communicatively coupled to the at radiation sensitive memory to check the known-signature word at at least a kHz rate to detects errors. Responsive to detecting an error in the known-signature word in the radiation sensitive memory, the radiation hardened logic circuitry sends an action command. At least one of: a memory size of the memory; a number of circuits in the logic circuitry; a clock rate for the checking the known-signature word; and at least one corruption threshold is selected based on system reliability requirements of the protected system including at least one of: an overall operational reliability requirement of the protected system; a probability of detection success; false alarm rates; and a required speed of detection.

20 Claims, 8 Drawing Sheets

(56) References Cited

U.S. PATENT DOCUMENTS

| | | |
|---|---|---|
| 7,009,183 B2 | 3/2006 | Wainer et al. |
| 7,142,004 B2 | 11/2006 | Calrson |
| 7,180,071 B2 | 2/2007 | Laackmann |
| 7,336,102 B2 | 2/2008 | Bernstein et al. |
| 7,411,197 B2 | 8/2008 | He et al. |
| 7,443,191 B2 | 10/2008 | Plants |
| 7,471,115 B2 | 12/2008 | Bernstein et al. |
| 7,473,904 B2 | 1/2009 | Abadeer et al. |
| 7,489,538 B2 | 2/2009 | Maki et al. |
| 7,509,541 B2 | 3/2009 | Minemier |
| 7,653,840 B1 * | 1/2010 | Taylor ............ G06F 11/0727 714/47.2 |
| 8,041,990 B2 | 10/2011 | O'Connor et al. |
| 8,332,722 B1 * | 12/2012 | Vera Rojas ....... H03M 13/3776 714/752 |
| 8,575,560 B1 | 11/2013 | Fechner |
| 8,723,548 B2 | 5/2014 | Chandrasekharan et al. |
| 2003/0111620 A1 * | 6/2003 | Gebele ............... G01T 1/2014 250/586 |
| 2003/0188219 A1 * | 10/2003 | DeRuiter ............... G06F 11/00 714/5.1 |
| 2004/0061060 A1 | 4/2004 | Layman et al. |
| 2004/0227094 A1 | 11/2004 | Tompa et al. |
| 2006/0170541 A1 | 8/2006 | Tompa et al. |
| 2006/0186342 A1 | 8/2006 | Burrger et al. |
| 2008/0281572 A1 | 11/2008 | Puri et al. |
| 2011/0078498 A1 | 3/2011 | Flatley |
| 2011/0099421 A1 | 4/2011 | Geist et al. |

* cited by examiner

RADIATION UPSET DETECTION

This patent application claims priority to U.S. Provisional Patent Application No. 62/012,905, entitled "RADIATION UPSET DETECTION" filed Jun. 16, 2014, which is hereby fully incorporated herein by reference.

This invention was made with Government support under the A-72 Program awarded by USAF. The Government has certain rights in the invention.

BACKGROUND

Radiation events can emit a pulse of neutrons. Any circuits that are impacted by the neutrons can be damaged. For example, processors and memories can be upset due to a neutron induced single event radiation environment. Circuitry can also be damaged by other types of radiation events. In some cases, a false indication of a radiation event of interest is detected. A false alarm can cause unnecessary reactions in the system and/or slow down the system.

SUMMARY

The present application relates to a radiation upset detector for use with a protected system. The radiation upset detector includes at least one radiation sensitive memory initialized with at least one respective known-signature word; and at least one radiation hardened logic circuitry communicatively coupled to exchange data with the at least one respective radiation sensitive memory in order to check the at least one known-signature word at at least a kHz rate to detects errors. At least a portion of the at least one radiation hardened logic circuitry is radiation hardened to withstand radiation events. Responsive to detecting an error in the known-signature word in the respective at least one radiation sensitive memory, the at least one radiation hardened logic circuitry is further configured to send an action command. At least one of: a memory size of the at least one radiation sensitive memory; a number of circuits in the at least one radiation hardened logic circuitry; a clock rate for the checking the at least one known-signature word; and at least one corruption threshold is selected based on system reliability requirements of the protected system including at least one of: an overall operational reliability requirement of the protected system; a probability of detection success; false alarm rates; and a required speed of detection.

DRAWINGS

Understanding that the drawings depict only exemplary embodiments and are not therefore to be considered limiting in scope, the exemplary embodiments will be described with additional specificity and detail through the use of the accompanying drawings, in which.

In accordance with common practice, the various described features are not drawn to scale but are drawn to emphasize specific features relevant to the exemplary embodiments. Reference characters denote like elements throughout figures and text.

DETAILED DESCRIPTION

Figure 1:
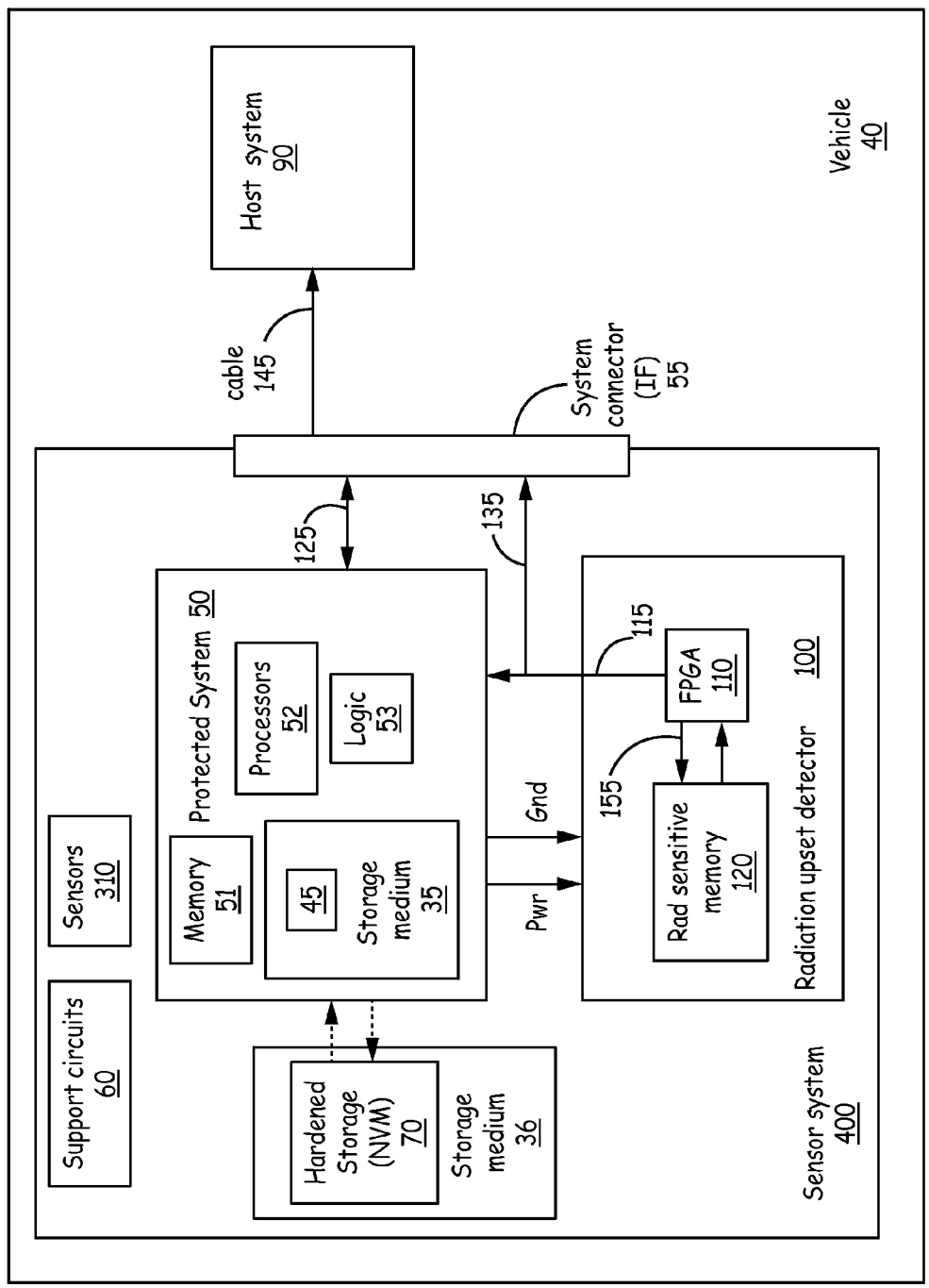
FIG. 1 shows an embodiment of a radiation upset detector in conjunction with a protected system in accordance with the present application.

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

For the reasons stated above and for other reasons stated below which will become apparent to those skilled in the art upon reading and understanding the specification, there is a need in the art for improved radiation event detection systems and methods to detect radiation events so mitigation measures can be taken before the system performance of a protected system is degraded. There are various types of radiation events. For a given application, some radiations events degrade the protected system while other radiation events do not degrade the protected system. A radiation event that degrades a protected system is referred to here as a "radiation event of interest". It is desirable to reduce false detections of radiation events of interest. Specifically, for applications that would abort a critical operation of a protected system based on a single false detection, it is desirable to drive the false alarm rate to zero in order to avoid unnecessarily aborting the critical operation.

The embodiments of the systems and methods described below are able to detect a radiation environment and to take mitigation measures before the protected system performance is degraded by the radiation. Embodiments of the radiation upset detector described herein include detection memory (also referred to herein as "radiation sensitive memory"), which has a higher sensitivity to the radiation environment than that of the hardware in the protected system. In one implementation of this embodiment, the detection memory is a dynamic memory. The protected system includes at least one system processor and at least one memory. The radiation upset detector includes at least one radiation sensitive memory that is initialized with at least one respective known-signature word and at least one radiation hardened logic circuitry. In the embodiments of the radiation event detection systems described herein at least one of: a memory size of the at least one radiation sensitive memory; a number of circuits in the at least one radiation hardened logic circuitry; a clock rate for the checking the at least one known-signature word; and at least one corruption threshold is selected based on system reliability requirements of the protected system. The system reliability requirements of the protected system include, but are not limited to: an overall operational reliability requirement of the protected system 50; a probability of detection success; false alarm rates; and a required speed of detection.

A false alarm occurs when the system outputs (sends) an indication that a radiation event has occurred for either: 1) a non-radiation event that is triggered by something other than radiation; or 2) the detection of radiation event that is not of interest, i.e., is not significant enough to require any action for the application of the protected system. The radiation upset detector, which protects the protected system, is tuned and or optimized to take appropriate system protection actions commanded for the protection of the protected system in order to meet the protected system reliability requirements.

The system and methods assume the radiation is uniform over the area in which the circuits and components of the radiation upset detector, the protected system, and the linking electronics are located. Specifically, for the separate circuits, which are spatially some small distance apart, the fluence of any damaging radiation is uniform over that separation distance. The embodiments disclosed herein are useful when the radiation is uniform over the area of the radiation upset detector and the device to be protected.

The radiation upset detectors described herein use a slightly more sensitive memory and monitoring circuit to detect when a radiation environment would trigger a single event upset and flag that a single event upset is likely. Similarly, the radiation upset detectors described herein use a slightly more sensitive memory and monitoring circuit to detect when cosmic radiation or nuclear radiation is in the environment. Any processors and memories in the protected system that are exposed to a radiation event (e.g., a neutron pulse or other types of radiation) are likely to be damaged. The detection memory is continuously checked by the radiation hardened logic circuitry at a high repetition checking rate.

When an error is detected in the radiation sensitive memory, an action command is sent to initiate appropriate action. The action commands are based on the level and/or type of detected radiation. The action command includes one or more of: a command to system reset to one or various components; a re-initialization of one or various components; a command to open up variances if a Kalman filter is used to estimated errors; and a command to output a message for degraded performance. In one implementation of this embodiment, an action command includes signals that initiate the commanded action. If the radiation sensitive memory in a radiation upset detector is determined to be corrupted, the system being protected is reset before any large scale corruption has occurred. In general, a reset is sent as a command for an action, as appropriate for the application and the detected corruption.

FIG. 1 shows a radiation upset detector 100 in a sensor system 400 in accordance with the present application. The sensor system 400 is in a vehicle 40 and includes a radiation upset detector 100, a protected system 50, hardened storage 70 in a storage medium 36, sensors 310 to aid the vehicle 40, and support circuits 60. The protected system 50 is communicatively coupled to a system connector 55 in the sensor system 400. A cable 145 is attached to the system connector 55 to communicatively couple a host system 90, which is also in the vehicle 40, to the protected system 50.

The protected system 50 includes at least one of: at least one memory 51, at least one processor 52, logic 53, and software 45 in a storage medium 35. The logic 53 is communicatively coupled to a hardened storage 70. The software 45 comprises appropriate program instructions that, when executed by the processor 52, perform the processing described here as being carried out by the software 45. Any processors 52 and memories 51 exposed to a radiation event are likely to be damaged by a neutron pulse, gamma rays, x-rays or other types of radiation.

The support circuits 60 are configured to drive signals 125 out of the sensor system 400 to the host system 90. In one implementation of this embodiment, signals 125 are driven to the host system 90 via the cable 145.

The radiation upset detector 100 includes at least one radiation sensitive memory 120 and radiation hardened logic circuitry 110. The radiation upset detector 100 is in the same environment as the protected system 50.

In one implementation of this embodiment, the radiation hardened logic circuitry 110 is a field programmable gate array (FPGA) 110. Other types of logic circuitry are possible. The radiation hardened logic circuitry 110 is also referred to here in as "FPGA 110". The FPGA 110 is configured to exchange data with the radiation sensitive memory 120. In one implementation of this embodiment, at least a portion of the radiation hardened logic circuitry 110 is radiation hardened to withstand radiation events. In another implementation of this embodiment, all of the radiation hardened logic circuitry 110 is radiation hardened to withstand radiation events.

The radiation sensitive memory 120 (also referred to herein as "detection memory 120") is initialized with a known-signature word. The radiation sensitive memory 120 includes a plurality of blocks with a respective plurality of addresses. The known-signature word is stored in at least a portion of the radiation sensitive memory 120 and is readable by the radiation hardened logic circuitry 110.

The radiation sensitive memory 120 is checked by the radiation hardened logic circuitry 110 at a high repetition rate (e.g., the memory is checked at a repetition rate of 1 kHz or more). While the protected system 50 is operational, the radiation hardened logic circuitry 110 continuously runs at the high repetition rate to: 1) read a selected portion (at least one selected address) of the radiation sensitive memory 120; and 2) compare the read section with the known-signature word. If there is a mismatch between the read section and the known-signature word, an error is detected. When the radiation hardened logic circuitry 110 detects an error, logic circuitry 110 is also configured to send at least one of: 1) an action command 115 to the radiation sensitive memory 120; 2) an action command 155 to the protected system 50; or 3) an action command 135 to the host system 90. The extent of a mismatch between the read section of the radiation sensitive memory 120 and the known-signature word is indicative of a type of error, which in turn is indicative of a type of radiation event. The radiation hardened logic circuity 110 executes algorithms to analyze the error and to send (output) action commands (typically as signals) to prompt an appropriate action as described in more detail below.

The action command 155 is used to prompt a reset of the radiation sensitive memory 120. The radiation sensitive memory 120 is reloaded with the known-signature words from the radiation hardened logic circuitry 110 upon a reset. In this manner, the corrupted word or corrupted words in a radiation sensitive memory are reinitialized. The action command 155 is also referred to herein as a "re-initialization signal 155".

In one implementation of this embodiment, the action command 115 is used to prompt a re-initialization of the protected system 50 as described in detail below. In one implementation of this embodiment, in the event of a re-initialization, at least a portion of the protected system 50 is reset with initial data that is stored in the hardened storage 70. The action command 115 is also referred to herein as a "reset signal 115".

For example, if an action command 115 is received at the logic 53 in the protected system 50, the logic 53 sends a signal to the hardened storage 70 to prompt the hardened storage 70 to send the initial data for at least one of the memory 52, the processor 52, and the logic 53 in the protected system 50 to re-initialize at least one of those protected components. In this manner, when the radiation sensitive memory 120 in the radiation upset detector 100 is determined to be corrupted, the protected system 50 is re-initialized before any large scale corruption has occurred. The hardened storage 70 is impervious to radiation and does not need to be reset or reinitialized. In one implementation of this embodiment, the hardened storage 70 is non-volatile memory (NVM). The logic 53 in the protected system 50 is also referred to herein as application-specific integrated circuit (ASIC) or "ASIC 53".

The action command 135 is sent from the radiation hardened logic circuitry 110 to the host system 90 in order to prompt the host system 90 to evaluate if the sensor system 400 is degraded. In this manner, a higher level system (e.g., a host system 90) is informed of the corrupted data and the radiation upset detector continues to monitor the radiation sensitive memory. In one implementation of this embodiment, if the host system 90 determines sensor system 400 is degraded, the host system 90 takes steps to deal with the degradation.

The logic circuitry 110 and logic 53 each includes or functions with software programs, firmware or other computer readable instructions for carrying out various methods, process tasks, calculations, and control functions, of the logic circuitry 100 and logic 53 as used in the sensor system 400.

The radiation upset detector 100 can be small, high speed, and consist of very simple interfaces to the protected system 50. By incorporating radiation upset detector 100 a sensor system 400 including the memory 51, processor 52, and logic 53 can potentially be categorized as "radiation hardened/tolerant" to the radiation environments of interest without incurring the high cost and schedule impact of directly implementing a radiation hardened component or radiation hardened processor and memory. The detection circuit design of the radiation upset detector 100 can be very simple and low cost with a small I/O count interface to the main board of the protected system 50. In one implementation of this embodiment, the radiation sensitive memory 120 is a commercial off the shelf (COTS) component.

In one implementation of this embodiment, the radiation sensitive memory 120 is initialized with a known-signature word that is 16 bits long. In another implementation of this embodiment, the radiation sensitive memory 120 is initialized with a known-signature word that is 32 bits long. In yet another implementation of this embodiment, the radiation sensitive memory 120 is initialized with a known-signature word that is at one address in the memory. In yet another implementation of this embodiment, the radiation sensitive memory 120 is initialized with a known-signature word that is at two or more addresses in the radiation sensitive memory 120. In yet another implementation of this embodiment, the radiation sensitive memory 120 is initialized with at least two known-signature words that are stored in at least two respective addresses in the radiation sensitive memory 120.

The length of the known-signature word and the location(s) of the known-signature word are configured based on the application and types of radiation being detected. For example, if the radiation upset detector 100 is configured to protect the protected system 50 from gamma rays due to cosmic events, then a single upset event is the application. In this case, the known-signature word may be distributed across a number of addresses in the radiation sensitive memory 120. For another example, if the radiation upset detector 100 is configured to protect the protected system 50 from nuclear radiation in the vicinity of a nuclear power plant, then nuclear radiation is the application. In this case, the known-signature word may be 16 bits in a single address in the radiation sensitive memory 120.

The methods and techniques described here may be implemented in digital electronic circuitry, or with a programmable processor (for example, a special-purpose processor or a general-purpose processor such as a computer) firmware, software, or in combinations of them. Apparatus embodying these techniques may include appropriate input and output devices, a programmable processor, and a storage medium tangibly embodying program instructions for execution by the programmable processor. A process embodying these techniques may be performed by a programmable processor executing a program of instructions to perform desired functions by operating on input data and generating appropriate output. The techniques may advantageously be implemented in one or more programs that are executable on a programmable system including at least one programmable processor coupled to receive data and instructions from, and to transmit data and instructions to, a data storage system, at least one input device, and at least one output device. Generally, a processor will receive instructions and data from a read-only memory and/or a random access memory.

These instructions are typically stored on any appropriate computer readable medium used for storage of computer readable instructions or data structures. The computer readable medium can be implemented as any available media that can be accessed by a general purpose or special purpose computer or processor, or any programmable logic device. Suitable processor-readable media may include storage or memory media such as magnetic or optical media. For example, storage or memory media may include conventional hard disks, Compact Disk-Read Only Memory (CD-ROM), volatile or non-volatile media such as Random Access Memory (RAM) (including, but not limited to, Synchronous Dynamic Random Access Memory (SDRAM), Double Data Rate (DDR) RAM, RAMBUS Dynamic RAM (RDRAM), Static RAM (SRAM), etc.), Read Only Memory (ROM), Electrically Erasable Programmable ROM (EEPROM), and flash memory, etc. Suitable processor-readable media may also include transmission media such as electrical, electromagnetic, or digital signals, conveyed via a communication medium such as a network and/or a wireless link.

Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and DVD disks. Any of the foregoing may be supplemented by, or incorporated in, specially-designed application-specific integrated circuits (ASICs)."

In one implementation of this embodiment, the host system is a Communications Management Unit (CMU). In another implementation of this embodiment, the host system 90 is a flight management system (FMS). In yet another implementation of this embodiment, the host system 90 is a computer. In yet another implementation of this embodiment, the host system 90 is a processor that is communicatively coupled to a higher level system.

In yet another implementation of this embodiment, the host system 90 is a computer and the vehicle 40 is an aircraft 40. In this case, the sensor system 400 senses the orientation and acceleration of the aircraft 40. In yet another implementation of this embodiment, the sensor system 400 with the radiation upset detector 100 is installed in a satellite 40. In yet another implementation of this embodiment, the host system 90 and the sensor system 400 are installed in a land-based or water-based vehicle 40.

Figure 2:
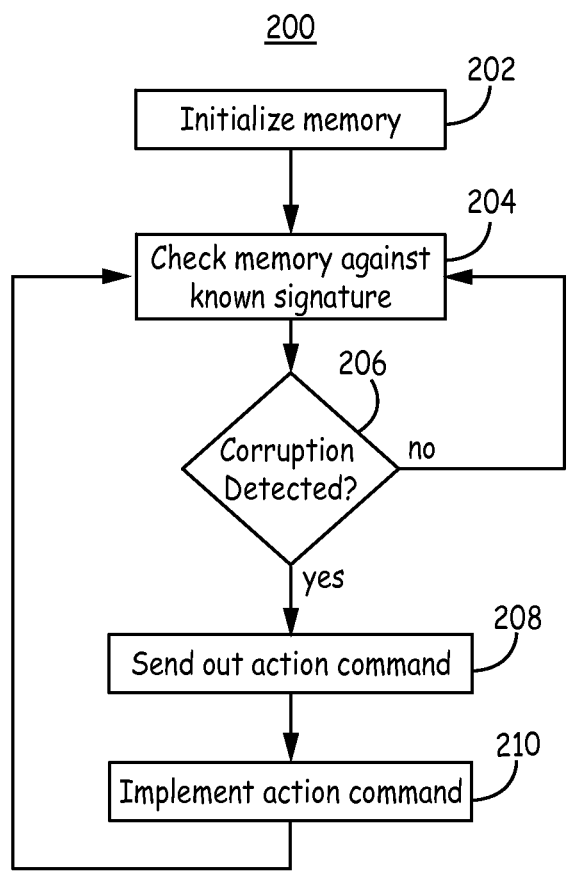
FIG. 2 shows an embodiment of a method of using a radiation upset detector to protect a protected system from a radiation event in accordance with the present application.

FIG. 2 shows a method 200 of using a radiation upset detector 100 to protect a protected system 50 from a radiation event in accordance with the present application. The method 200 is implemented in the radiation upset detector 100 to periodically check the at least one known-signature word in the radiation sensitive memory for errors in at least one radiation hardened logic circuitry. The rate of checking is at least a kHz rate.

Method 200 is implemented in a radiation upset detector 100 that is designed for use with the protected system 50 based on the applications implemented by the protected system 50. Since, the system reliability requirements of the protected system 50 are based on the application being implemented by the protected system 50, the design of the radiation upset detector 100 is based on system reliability requirements of the protected system 50 and method 200 is implemented to detect a radiation event based on the system reliability requirements. In one implementation of this embodiment, an overall operational reliability requirement of the protected system 50 dictates the radiation detection configuration. In another implementation of this embodiment, the system reliability requirement of the protected system 50 for a probability of detection success dictates the radiation detection configuration. In yet another implementation of this embodiment, the system reliability requirement of the protected system 50 for false alarm rates dictates the radiation detection configuration. In yet another implementation of this embodiment, the system reliability requirement of the protected system 50 for required speed of detection dictates the radiation detection configuration. In yet another implementation of this embodiment, two or more of the system reliability requirements of the protected system 50 dictates the radiation detection configuration. For example, in one embodiment, method 200 is implemented to detect a single radiation event based on a false alarm rate less than the system requirements of the protected system 50 and a probability of detection greater than the system requirements of the protected system 50.

The design parameters based on system reliability requirements of the protected system 50 are used by the designer of the radiation upset detector 100 when selecting at least one of: a memory size of the at least one radiation sensitive memory; a number of circuits in the at least one radiation hardened logic circuitry (e.g., a number of FPGA's); a clock rate for the checking of the signature word; and at least one corruption threshold. The terms "threshold" and "corruption threshold" are used interchangeably herein. The required speed of detection is based on the application of the protected system.

At block 202, the radiation sensitive memory 120 is initialized. The radiation sensitive memory 120 is pre-loaded with at least one known-signature word at system initialization. In one implementation of this embodiment, the known-signature word is a string of words stored in the radiation sensitive memory 120. The radiation sensitive memory 120 is sensitive to radiation events so that an impinging neutron is likely to flip a bit from a 1 to a 0 or from a 0 to a 1.

At block 204, logic circuitry 110 (e.g., shown as FPGA 110 in FIG. 1) in the radiation upset detector 100 runs continuously at a high repetition rate to check the data in the radiation sensitive memory 120 for the known-signature word or words. The logic circuitry 110 checks the complete string of the known-signature word or words at a kHz rate or faster.

At block 206, the logic circuitry 110 determines if corruption of the data is detected. If there is an error (i.e., data corruption) in the known-signature word or string of signature words, the flow of method 200 proceeds from block 206 to block 208. In one implementation of this embodiment, the data in the radiation sensitive memory 120 is determined to be corrupted if the logic circuitry 110 detects even a single bit is incorrect. In another implementation of this embodiment, the data is determined to be corrupted if a preselected number (e.g., a threshold) of bits are incorrect. With proper selection of one or more thresholds, the radiation upset detector 100 is optimized to detect the desired radiation environment thus maximizing reliability and mitigating false alarms for the protected system 50. The radiation upset detector 100 initiates proper actions, which are commanded based on which of the at least one threshold is exceeded.

At block 208, an action command 115, 155, and/or 135 is sent from the FPGA 110 to the radiation sensitive memory 120 and/or the protected system 50 responsive to the detection of corrupt data. At block 210, the action command sent at block 208 is implemented.

In one implementation of this embodiment, the action command 155 is sent to the radiation sensitive memory 120 at block 208. The action command 155 sent from the at least one radiation hardened logic circuitry 110 is a command to re-initialize the radiation sensitive memory 120. In this case, at block 210, the radiation sensitive memory 120 is reinitialized responsive to the detection of corrupt data. The initial data pre-loaded with at least one known-signature word at system initialization during block 202 is reinstalled in the radiation sensitive memory 120. In one implementation of this embodiment, the radiation hardened logic circuity 110 sends the at least one known-signature word, which is stored in the radiation hardened logic circuity 100, to the radiation sensitive memory 120 as part of the action command 155.

In another implementation of this embodiment, the action command 115 is sent to the protected system 50 at block 208. The action command 115 is a command to initiate a reset in at least one component in the protected system 50 communicatively coupled to the at least one radiation hardened logic circuitry 110. Responsive to the action command 115 being sent to the protected system 50 at block 208, the protected system 50 is reset at block 210. For example, one or more of the memory 51, at least one processor 52 and logic 53 may be reinitialized when initial data in the hardened storage 70 (in storage medium 36) is sent to the ASIC 53.

In yet another implementation of this embodiment, an action command 135 is sent to the host system 90 at block 208. The host system 90 acts on this action command 135 to set up a-priori knowledge of any performance impact due to the error. Additionally, in this case, at block 210, the host system 95 may prompts a reset of one or more of the components 51, 52, and 53 of the protected system 50 and/or prompts a re-initialization of the radiation sensitive memory 120.

In one implementation of an embodiment, in which the error is significant, the radiation hardened logic circuity 100 sends action commands 115, 155, and 135 at block 208 and appropriate mitigation actions are taken before the system performance of the protected system 50 is degraded.

In another implementation of this embodiment, both the action command 155 and the action command 135 are sent at block 208. In this case, the action command 135 is used to inform the host system 90 that a reset of the radiation sensitive memory 120 has occurred. In this case, the host system 90 acts on this action command 135 to set up a-priori knowledge of any performance impact due to the reset itself as well as any unmitigated performance transients realized prior to the reset of the radiation sensitive memory 120. In this case, at block 210, the host system 95 may prompt a reset of one or more of the components 51, 52, and 53 of the protected system 50.

In one implementation of an embodiment in which a single bit is incorrect, the radiation hardened logic circuity 100 sends an action command 155 to reset the radiation sensitive memory 120, but does not send action commands 115 or 135 the protected system or the host system 90.

If no error is detected at block 206, the flow proceeds from block 206 to block 204 and the logic circuitry 110 in the radiation upset detector 100 continues to check the data in the radiation sensitive memory 120 for the known-signature words.

Since the radiation upset detector 100 is periodically checked at the rate of more than 1 kHz, the flow of method 200 returns to block 204 in less than 0.001 seconds regardless of whether or not an error is detected at block 206. The process of flowing between blocks 202 and 204 in method 200 is implemented in a continuous flow, and this is referred to herein as a continuous flow of periodic checks at a fast rate. Likewise, the process of flowing from blocks 202 through to 210 and back to 202 in method 200 is implemented in a continuous flow, and this is referred to herein as a continuous flow of periodic checks at a fast rate, which is also referred to herein as a continuous check the data in the radiation sensitive memory 120.

Since the data in the radiation sensitive memory 120 is being checked at such a fast rate, any performance corruption of the at least the memory 51, at least one processor 52, and logic 53 is largely mitigated. Since the radiation sensitive memory 120 is more sensitive to the radiation than the other devices/circuits in the sensor system 400, the radiation sensitive memory 120 is more likely to fail before any of the devices/circuits (e.g., the memory 51, at least one processor 52, and logic 53) in the protected system 50.

Figure 3:
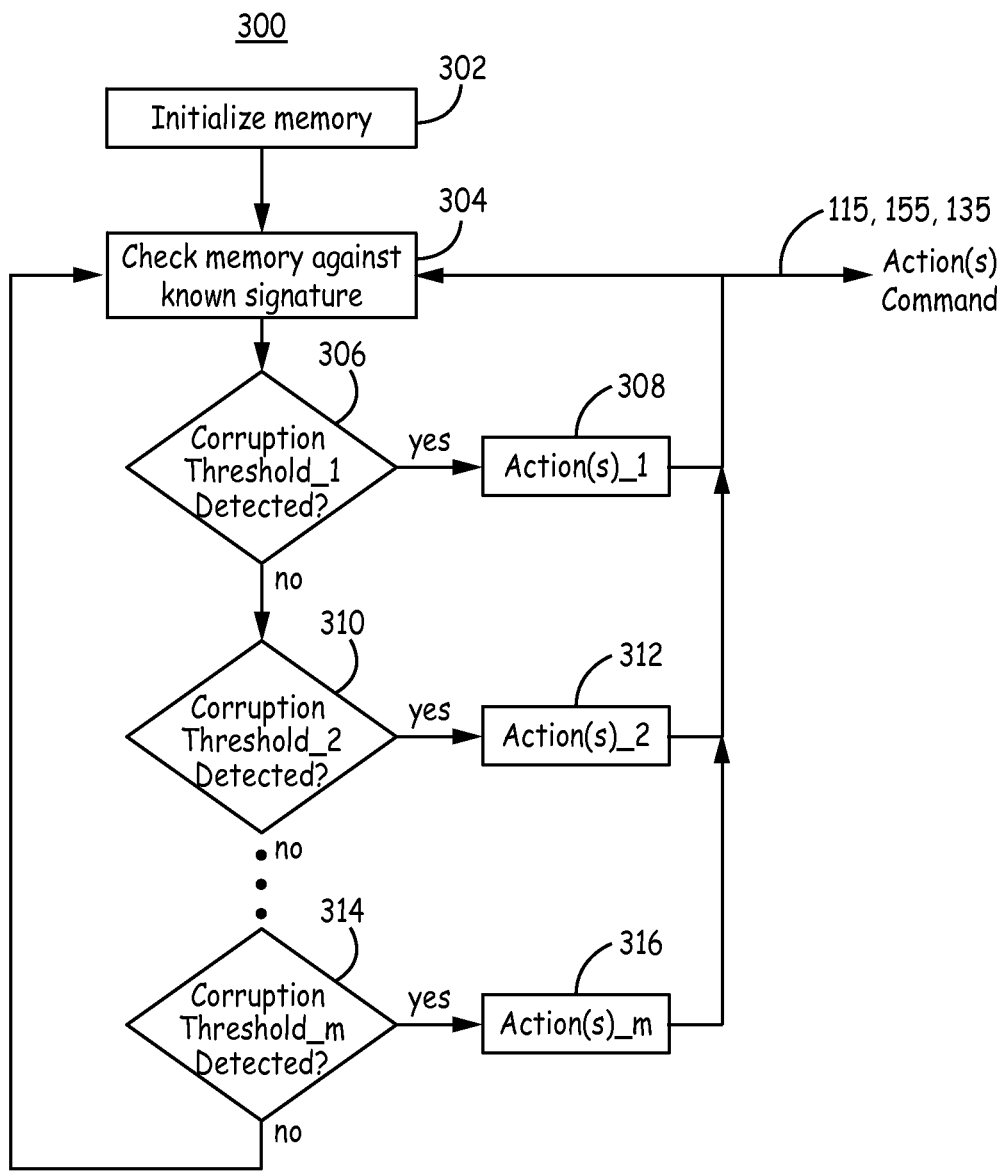
FIG. 3 shows an embodiment of a method of using a radiation upset detector to protect a protected system from a radiation event in accordance with the present application.

FIG. 3 shows a method 300 of using a radiation upset detector 100 to protect a protected system 50 from a radiation event in accordance with the present application. The process of method 300 uses plurality of corruption thresholds (i.e., m corruption thresholds, where m is a positive integer) to determine which of a respective plurality of actions are to be implemented to protect the protected system 50. The method 300 is implemented in the radiation upset detector 100 in a continuous flow of periodic checks at a fast rate, to check the at least one known-signature word in the radiation sensitive memory for errors. The rate of checking is at least a kHz rate.

Method 300 is implemented in a radiation upset detector 100 that is designed to protect the protected system 50 based on the applications implemented by the protected system 50 as described above with reference to FIG. 2. With a proper selection of the memory size, number of FPGAs, clock rate, and corruption thresholds, the reliability requirements of the protected system 50 are tuned and appropriate system protection actions commanded. In this manner, the occurrence of a false alarm is minimized, the probability of detection is optimized, and the required speed of detection is optimized in accordance with the system requirements. In one implementation of this embodiment, method 300 is implemented to detect a single radiation event upset with a false alarm rate less than the system requirement of the protected system 50 and a probability of detection greater than the system requirement of the protected system 50.

At block 302, the radiation sensitive memory 120 is initialized. The detection memory 120 is pre-loaded with at least one known-signature word at system initialization. In one implementation of this embodiment, the known-signature word is a string of words stored in one or more regions of the radiation sensitive memory 120.

At block 304, logic circuitry 110 (e.g., shown as FPGA 110 in FIG. 1) in the radiation upset detector 100 checks the data in the radiation sensitive memory 120 for the known-signature words. The logic circuitry 110 checks the complete string of signature words at a kHz rate or faster. The frequency of the check is based on the application and on the system requirements.

At block 306, the logic circuitry 110 determines if corruption of the data is detected exceeds a first corruption threshold. The first corruption threshold is also referred to herein as a "maximum corruption threshold".

If the logic circuitry 110 determines the detected corruption in the data exceeds the first corruption threshold (i.e., the data corruption is greater than the first corruption threshold) at block 306, the process flows to block 308. At block 308, at least one first action command is sent to initiate at least one first action to mitigate the damage to the protected system 50. Then, the process of method 300 proceeds back to block 304 and logic circuitry 110 continues to check the data in the radiation sensitive memory 120 for the known-signature words.

If the logic circuitry 110 determines the detected corruption in the data does not exceed the first corruption threshold (i.e., the data corruption is less than the first corruption threshold) at block 306, the process flows to block 310.

At block 310, the logic circuitry 110 determines if the detected corruption of the data exceeds a second corruption threshold. The second corruption threshold is less severe than the first corruption threshold. Thus, the damage to the radiation sensitive memory 120 (and the protected system 50) when the second corruption threshold is exceeded is less severe the damage to the radiation sensitive memory 120 (and the protected system 50) when the first corruption threshold is exceeded.

If the logic circuitry 110 determines the detected corruption in the data exceeds the second corruption threshold (i.e., the data corruption is greater than the second corruption threshold) at block 310, the process flows to block 312. At block 312, at least one second action command is sent to initiate at least one second action to mitigate damage to the protected system 50. Since the second corruption threshold is less severe than the first corruption threshold the second actions taken to mitigate damage to the protected system 50 are less than the first actions taken to mitigate damage to the protected system 50. For example, the first action command may initiate a complete re-initialization of all the components in the protected system 50 while the second action command may initiate a complete re-initialization of a subset of the components in the protected system 50.

Then, the process of method 300 proceeds back to block 304 and logic circuitry 110 continues to check the data in the radiation sensitive memory 120 for the known-signature words.

If the logic circuitry 110 determines the detected corruption in the data does not exceed the second corruption threshold (i.e., the data corruption is less than the second corruption threshold) at block 310, the process flows to block 314.

At block 314, the logic circuitry 110 determines if the detected corruption of the data exceeds an $m^{th}$ corruption threshold. The $m^{th}$ corruption threshold is less severe than the first and the second corruption thresholds. The $m^{th}$ corruption threshold is referred to herein as a "minimum corruption threshold" or a "minimum threshold". If the $m^{th}$ corruption threshold is exceeded, the damage to the radiation sensitive memory 120 is less than if the first corruption threshold is exceeded and is less than if the second corruption threshold is exceeded.

If the logic circuitry 110 determines the detected corruption in the data exceeds the $m^{th}$ corruption threshold (i.e., the data corruption is greater than the $m^{th}$ corruption threshold) at block 314, the process flows to block 316. At block 316, at least one $m^{th}$ action command is sent to initiate at least one $m^{th}$ action to mitigate damage to the protected system 50. Then, the process of method 300 proceeds back to block 304 and logic circuitry 110 continues to check the data in the radiation sensitive memory 120 for the known-signature words.

Since the $m^{th}$ corruption threshold is less severe than the first corruption threshold, at least one $m^{th}$ action to mitigate damage to the protected system 50 is less than the first actions or the second actions required to mitigate damage to the protected system 50. In one implementation of this embodiment, the $m^{th}$ corruption threshold and the $m^{th}$ action command are a third corruption threshold and a third action command. In another implementation of this embodiment, the process of method 300 includes four or more iterations of detecting if the corruption of the data exceeds four or more corruption thresholds.

Actions to mitigate damage (i.e., mitigation measures) include, but are not limited to: 1) reinitializing a corrupted word or corrupted words in a radiation sensitive memory; 2) informing a higher level system of the event; 3) sending an action command to the protected system 50 to reset one or more components 51-53 in the protected system 50; and 4) no action. In one implementation of this embodiment, the action command sent to the protected system 50 resets the logic 53 and a memory 51, shuts down the protected system 50, and restarts the protected system 50. In one implementation of this embodiment, the action command sent to the radiation sensitive memory 120 reinitializes the entire radiation sensitive memory 120.

In one implementation of this embodiment, a fist action command initiates a complete re-initialization of all the components in the protected system 50 and reinitializing a corrupted word or corrupted words in a radiation sensitive memory 120; a second action command initiates a complete re-initialization of a subset of the components in the protected system 50 and reinitializing a corrupted word or corrupted words in a radiation sensitive memory 120; and an $m^{th}$ action command reinitializes a corrupted word or corrupted words in a radiation sensitive memory 120.

If the logic circuitry 110 determines the detected corruption in the data does not exceed the third corruption threshold at block 314, the process flows to block 304. Since the radiation upset detector 100 is periodically checked at the rate of more than 1 kHz, the flow of method 300 continuously returns to block 304 in less than 0.001 seconds regardless of whether or not an error is detected at block 306, 310, or 314.

In one implementation of this embodiment, there are only the first and second corruption thresholds.

The logic circuitry 100 is configured to execute algorithms to determine if an error as has occurred based on the application (e.g., which type of radiation environment is to be detected). One skilled in the art understands that different types of radiation environments have different radiation signatures. The algorithms executed by the logic circuitry 100 are designed to detect the radiation signature of interest. In one implementation of this embodiment, an algorithm calculates the probability that mismatch between the known-signature word and the word read (in the last iteration) from the radiation sensitive memory 120 is due to a first type of radiation environment but not a second type of radiation environment. This embodiment requires at least two thresholds. A first threshold is based on a first type of radiation environment (i.e., first application) that typically creates a first type of error in the radiation sensitive memory 120. Thus, the first type of error triggers a response by exceeding a first threshold. The second threshold is based on a second type of radiation environment (e.g., second application) that typically creates a second type of error in the radiation sensitive memory 120. Thus, the second type of error triggers a response by exceeding a second threshold. As is understandable to one skilled in the art, the thresholds described herein are designed to distinguish between radiation signatures for different radiation environments. As defined herein, the threshold for a type of radiation environment that has the lowest probability of damaging the protected system 50 is a minimum threshold. As defined herein, the threshold for a type of radiation environment that has the highest probability of damaging the protected system 50 is a maximum threshold.

Figure 4:
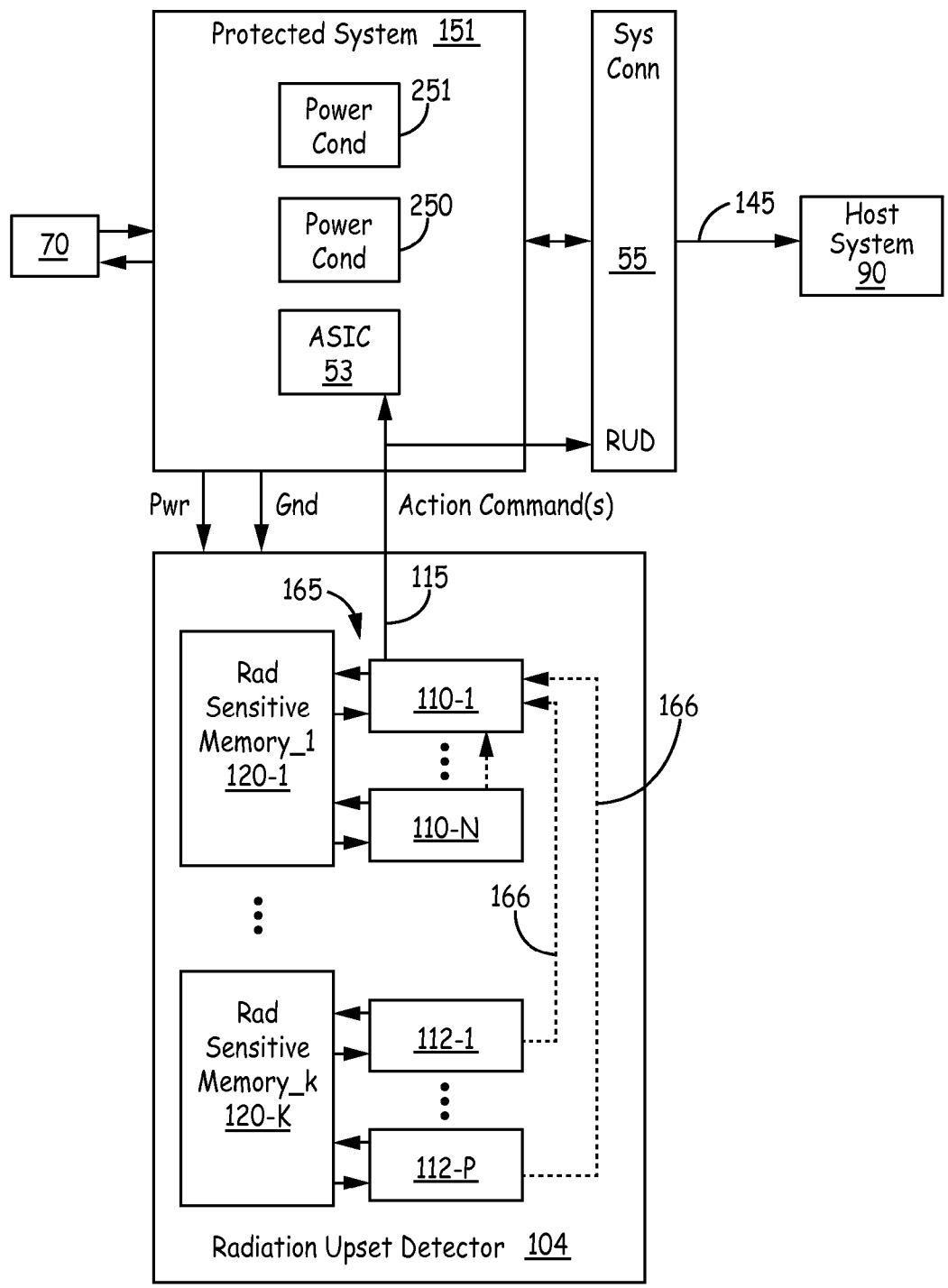
FIG. 4 shows an embodiment of a radiation upset detector in conjunction with a protected system in accordance with the present application.

FIG. 4 shows an embodiment of a radiation upset detector 104 in conjunction with a protected system 151 in accordance with the present application. As shown in FIG. 4, the protected system 151 includes logic 153 (ASIC 153), drivers 250, and power conditioning circuits 251. In embodiments, the protected system 151 also includes one or more of the components in the protected system 150 shown in FIG. 1 and described above with reference to FIG. 1. As shown in FIG. 4, the radiation upset detector 104 includes a plurality of radiation sensitive memories 120(1-K), where K is a positive integer, and a plurality of radiation hardened logic circuitry shown as FPGA 110(1-N) to FPGA 112(1-P), where N is a positive integer and P is a positive integer. The FPGA 112(1-P) is also referred to here in as "radiation hardened logic circuitry 112(1-P)".

In this embodiment, the first radiation sensitive memory 120-1 is initialized with a first-known-signature word, and the $K^{th}$ radiation sensitive memory 120-K is initialized with a $K^{th}$-known-signature word at block 202 of method 200 or at block 302 of method 300.

The radiation sensitive memory 120-1 is communicatively coupled via links and/or interfaces to output and input action commands 165 (signals 165) to and from the FPGA 110-1 to FPGA 110-N. The FPGAs 110(1-N) check the first radiation sensitive memory 120-1 for errors through a continuous flow of periodic checks at a fast rate. In one implementation of this embodiment, FPGAs 110(1-N) perform a continuous flow of periodic checks at a fast rate to check the first radiation sensitive memory 120-1 for errors using method 200 described above with reference to FIG. 2. In one implementation of this embodiment, FPGAs 110(1-N) perform a continuous flow of periodic checks at a fast rate to check the first radiation sensitive memory 120-1 for errors using method 300 described above with reference to FIG. 3.

If any of the FPGAs 110(1-N) finds an error, the $i^{th}$ FPGA-i (i is a positive integer), which found the error, sends an action command 165 (e.g., a re-initialization signal 165) to re-initialize the radiation sensitive memory 120-i. In one implementation of this embodiment, the FPGAs 110(1-N) are set to check the respective memory 120-1. When the N FPGA's each check the radiation sensitive memory 120-1 at a rate of a kHz, then the effective rate of checking is N*kHz. In this manner, the FPGAs 110(1-N) check the first radiation sensitive memory 120-1 for errors through a continuous flow of periodic checks at a fast rate and reset the radiation sensitive memory 120-1 if an error is found based on a mismatch between the known signature word and the word read by the FPGAs 110(1-N).

In one implementation of this embodiment, the N FPGAs 1101-N) are set to check the respective memory 120-1 simultaneously. In another implementation of this embodiment, the N FPGAs 110(1-N) are set to check the respective memory 120-1 in a staggered manner so that each of the N FPGAs 110(1-N) begins to check at time that is off set from the other (N−1) FPGAs 110(1-N) by at least (1/N)*(repetition rate). In one implementation of this embodiment, the FPGAs 110(1-N) each checks a different location of the radiation sensitive memory 120-1. In another implementation of this embodiment, the FPGAs 110(1-N) each checks a different known-signature word in the radiation sensitive memory 120-1.

The radiation sensitive memory 120-K is communicatively coupled to the FPGA 112-1 to FPGA 112-P. The FPGAs 112(1-P) check the $K^{th}$ radiation sensitive memory 120-K for errors through a continuous flow of periodic checks at a fast rate. In one implementation of this embodiment, FPGAs 112(1-P) perform a continuous flow of periodic checks at a fast rate to check the $K^{th}$ radiation sensitive memory 120-K for errors using method 200 described above with reference to FIG. 2. In one implementation of this embodiment, FPGAs 112(1-P) perform a continuous flow of periodic checks at a fast rate to check the $K^{th}$ radiation sensitive memory 120-K for errors using method 300 described above with reference to FIG. 3.

If any of the FPGAs 112(1-P) finds an error, the $i^{th}$ FPGA-i that found the error sends an action command 165 (e.g., a re-initialization signal 165) to re-initialize the radiation sensitive memory 120-K. When the 'P' FPGA's each check the radiation sensitive memory 120-K at a rate of a kHz, then the effective rate of checking is P*kHz thus effectively increasing the speed of detection. In this manner, the FPGAs 112(1-P) periodically check the radiation sensitive memory 120-K for errors and reset the radiation sensitive memory 120-K if an error is found based on a mismatch between the known-signature word and the word read by the FPGAs 112(1-P).

In one implementation of this embodiment, the P FPGAs 112(1-P) are set to check the respective memory 120-K simultaneously. In another implementation of this embodiment, the P FPGAs 112(1-P) are set to check the respective memory 120-K in a staggered manner so that each of the P FPGAs 112(1-P) begins to check at time that is off set from the other (P−1) FPGAs 112(1-P) by at least (1/P)*(repetition rate). In yet another implementation of this embodiment, the FPGAs 112(1-P) each checks a different location of the radiation sensitive memory 120-K. In yet another implementation of this embodiment, the FPGAs 112(1-P) each checks a different known-signature word in the radiation sensitive memory 120-K.

As shown in FIG. 4, if any of the FPGAs 110(2-N) or any of the FPGAs 112(1-P) finds an error, the FPGA 110(2-N) and/or the FPGA 112(1-P) that found the error sends a signal 166 to the FPGA 110-1. In this manner, a subset of radiation hardened logic circuitry 110(2-N) and 112(1-P) of the plurality of radiation hardened logic circuitry 110(1-N) and the 112(1-P) is communicatively coupled to send output to the radiation hardened logic circuitry 110-1. The FPGA 110-1 sends an action command 115 to the protected system 151 to initiate a reset in at least one component 53, 250, or 251 in the protected system 151 communicatively coupled to radiation hardened logic circuitry 110-1 in the radiation upset detector 104.

FIGS. 5-8 show embodiments of radiation upset detectors 103-106, respectively, in accordance with the present application.

Figure 5:
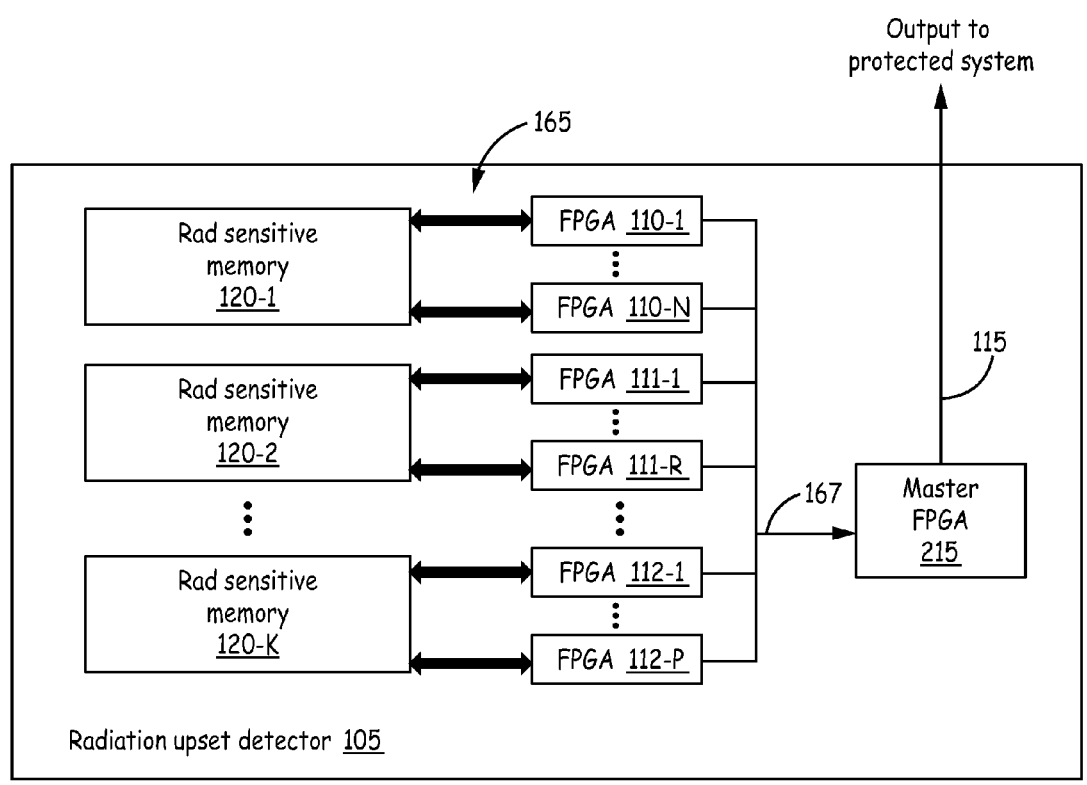
FIGS. 5-8 show embodiments of radiation upset detectors in accordance with the present application.

FIG. 5 shows an embodiment of a radiation upset detector 105 configured to output an action command 115 to the protected system (e.g., protected system 50) in accordance with the present application. As shown in FIG. 4, the radiation upset detector 105 includes a plurality of radiation sensitive memories 120(1-K), and a plurality of radiation hardened logic circuitry shown as FPGA 110(1-N), FPGA 112(1-P) and FPGA 111(1-R), where R is a positive integer. The FPGA 111(1-R) are also referred to here in as "radiation hardened logic circuitry 111(1-R)".

The radiation sensitive memory 120-1 is communicatively coupled via links and/or interfaces to output and input signals 165 to and from the FPGA 110-1 to FPGA 110-N. The radiation sensitive memory 120-2 is communicatively coupled via links and/or interfaces to output and input signals 165 to and from the FPGA 111-1 to FPGA 111-R. The radiation sensitive memory 120-K is communicatively coupled via links and/or interfaces to output and input signals 165 to and from the FPGA 112-1 to FPGA 112-P. The signals 165 sent from the radiation hardened logic circuity FPGA 110(1-N), FPGA 112(1-P) and FPGA 111(1-R) to the respective radiation sensitive memory 120(1-K) are action commands 165.

In this embodiment, the first radiation sensitive memory 120-1 is initialized with a first-known-signature word, and the second radiation sensitive memory 120-2 is initialized with a second-known-signature word, and the third radiation sensitive memory 120-3 is initialized with a third-known-signature word at block 202 of method 200 or at block 302 of method 300. In one implementation of this embodiment, the one or more of the first-known-signature word, the second-known-signature word, and the third-known-signature word are the same known-signature word.

The FPGA 110(1-N), FPGA 111(1-R), and FPGA 112(1-P) are configured to detect corruption of data in the respective communicatively coupled radiation sensitive memory 120(1-K) in accordance with block 206 of method 200 (FIG. 2) or in accordance with blocks 306, 310, and/or 314 of method 300 (FIG. 3).

The radiation upset detector 105 includes a master FPGA 215. The master FPGA 215 is communicatively coupled to the FPGA 110(1-N), FPGA 111(1-R), and FPGA 112(1-P) to accept one or more signals 167 indicative of an error in one of the radiation sensitive memories 120(1-K). The master FPGA 215 is communicatively coupled to the protected system to send an action command 115 to the protected system to initiate a reset in at least one component in the protected system upon accepting one or more signals 167 from one of the FPGA 110(1-N), FPGA 111(1-R), and FPGA 112(1-P).

FIG. 5 differs from FIG. 4 in that the master FPGA 215 sends the action command 115 to the protected system instead of the first FPGA 110-1 sending the action command 115 to the protected system.

Figure 6:
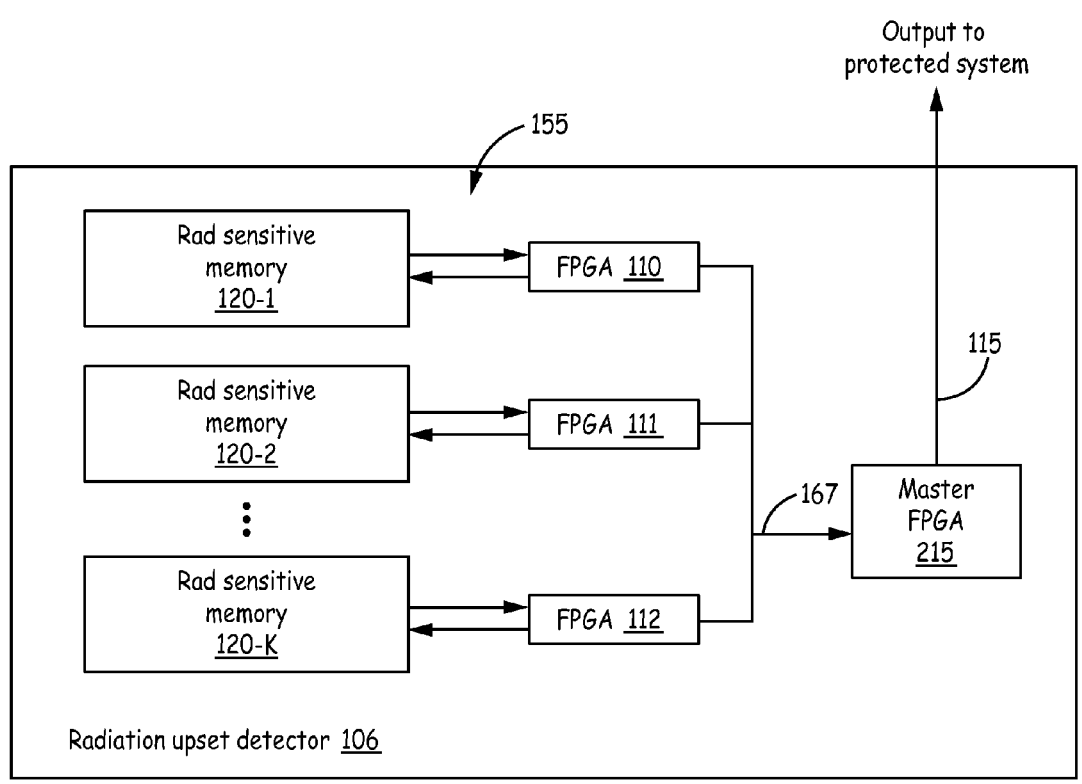

FIG. 6 shows an embodiment of a radiation upset detector 106 configured to output an action command 115 to the protected system (e.g., protected system 50) in accordance with the present application. FIG. 6 differs from FIG. 5 in that a single FPGA checks a respective one of a plurality of memories 120(1-K). As shown in FIG. 6, the radiation upset detector 106 includes a plurality of radiation sensitive memories 120(1-K). Each radiation sensitive memories 120 (1-K) is checked by a single respective radiation hardened logic circuitry; FPGA 110, FPGA 111, and FPGA 112.

The radiation sensitive memory 120-1 is communicatively coupled via a link and/or interface to output and input signals 155 to and from the FPGA 110. The radiation sensitive memory 120-2 is communicatively coupled via links and/or interfaces to output and input signals 155 to and from the FPGA 111. The radiation sensitive memory 120-K is communicatively coupled via links and/or interfaces to output and input signals 155 to and from the FPGA 112. The signals 155 sent from the FPGA 110, FPGA 111, and FPGA 112 to the respective radiation sensitive memory 120(1-K) are action commands 155.

The radiation upset detector 106 includes the master FPGA 215, which is similar in structure and function to the master FPGA 215 of FIG. 4. The master FPGA 215 is communicatively coupled to the FPGA 110, FPGA 111, and FPGA 112 to accept one or more signals 167 indicative of an error in one of the radiation sensitive memories 120(1-K). The master FPGA 215, upon accepting a signal 167 from at least one of the FPGA 110, FPGA 111, and FPGA 112, is communicatively coupled to the protected system to send an action command 115 to the protected system, which, in one implementation, initiates a reset in at least one component in the protected system.

Figure 7:
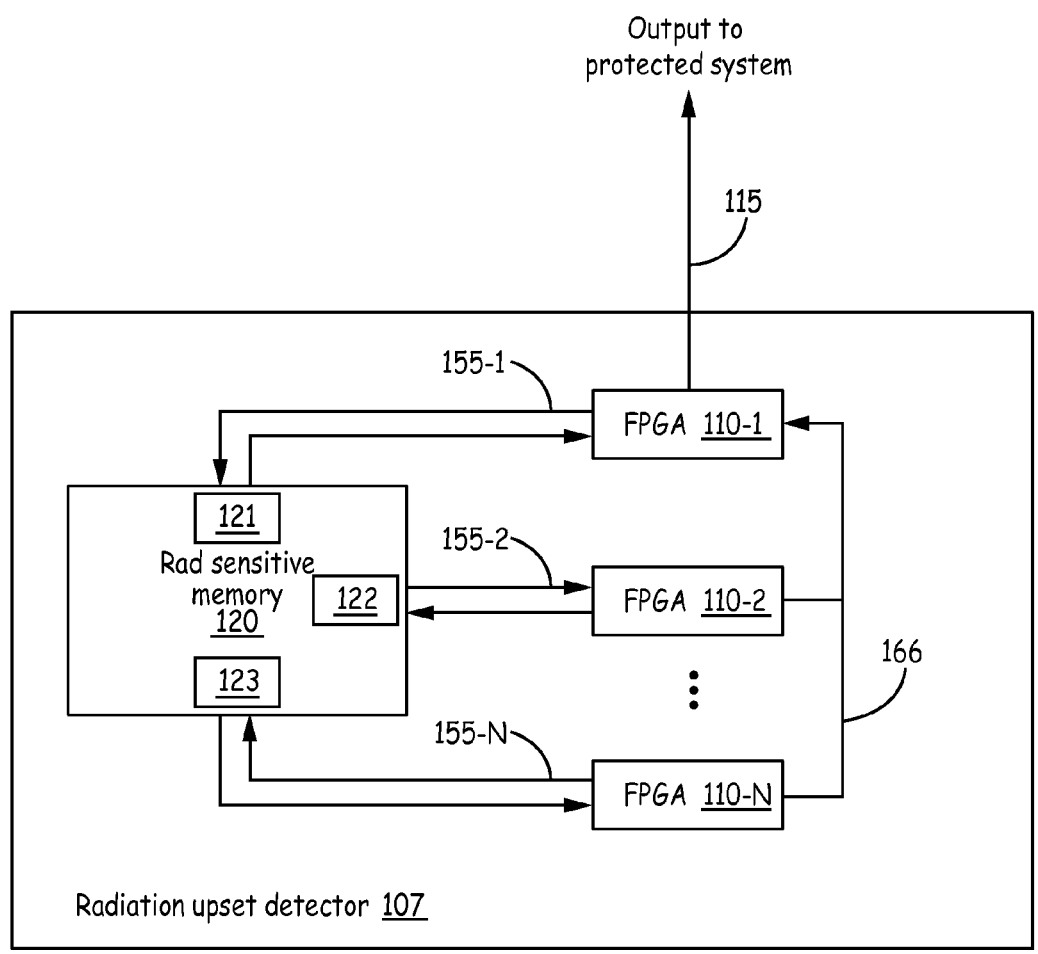

FIG. 7 shows an embodiment of a radiation upset detector 107 configured to output an action command 115 to the protected system (e.g., protected system 50) in accordance with the present application. FIG. 7 differs from FIG. 4 in that a plurality of FPGA's checks a single memory 120. There is no master FPGA in the radiation upset detector 107.

As shown in FIG. 7, the radiation upset detector 107 includes a radiation sensitive memory 120. The radiation sensitive memory 120 is checked by a plurality of radiation hardened logic circuitry 110 (1-N).

In the embodiment of the radiation upset detector 107, the first FPGA 110-1 checks a first-known-signature word in a first location 121 on the radiation sensitive memory 120. The second FPGA 110-2 checks a second-known-signature word in a second location 122 on the radiation sensitive memory 120. And similarly, the third FPGA 110-3 checks a third-known-signature word in a third location 123 on the radiation sensitive memory 120. In this embodiment, the radiation sensitive memory 120 of the radiation upset detector 107 is initialized with a first-known-signature word, with a second-known-signature word, and with a third-known-signature word at block 202 of method 200 or at block 302 of method 300. In one implementation of this embodiment, the first, second, and third locations 121, 122, 123 are at addresses in three blocks on the radiation sensitive memory 120. In another implementation of this embodiment, the first, second, and third locations 121, 122, 123 are at addresses in two blocks on the radiation sensitive memory 120. In yet another implementation of this embodiment, the first, second, and third locations 121, 122, 123 are at addresses in one block on the radiation sensitive memory 120. In yet another implementation of this embodiment, the one or more of the first-known-signature word, the second-known-signature word, and the third-known-signature word are the same known-signature word.

The radiation sensitive memory 120 is communicatively coupled via a link and/or interface to output and input signals 155-1 to and from the FPGA 110-1. The radiation sensitive memory 120 is also communicatively coupled via a link and/or interface to output and input signals 155-2 to and from the FPGA 110-2. The radiation sensitive memory 120 is also communicatively coupled via a link and/or interface to output and input signals 155-N to and from the FPGA 110-N. The signals 155-1, 155-2, and 155-N sent from the radiation hardened logic circuity FPGA 110-1, FPGA 110-2 and FPGA 110-N to the respective radiation sensitive memory 120(1-K) are action commands 155-1, 155-2, and 155-N.

Figure 8:
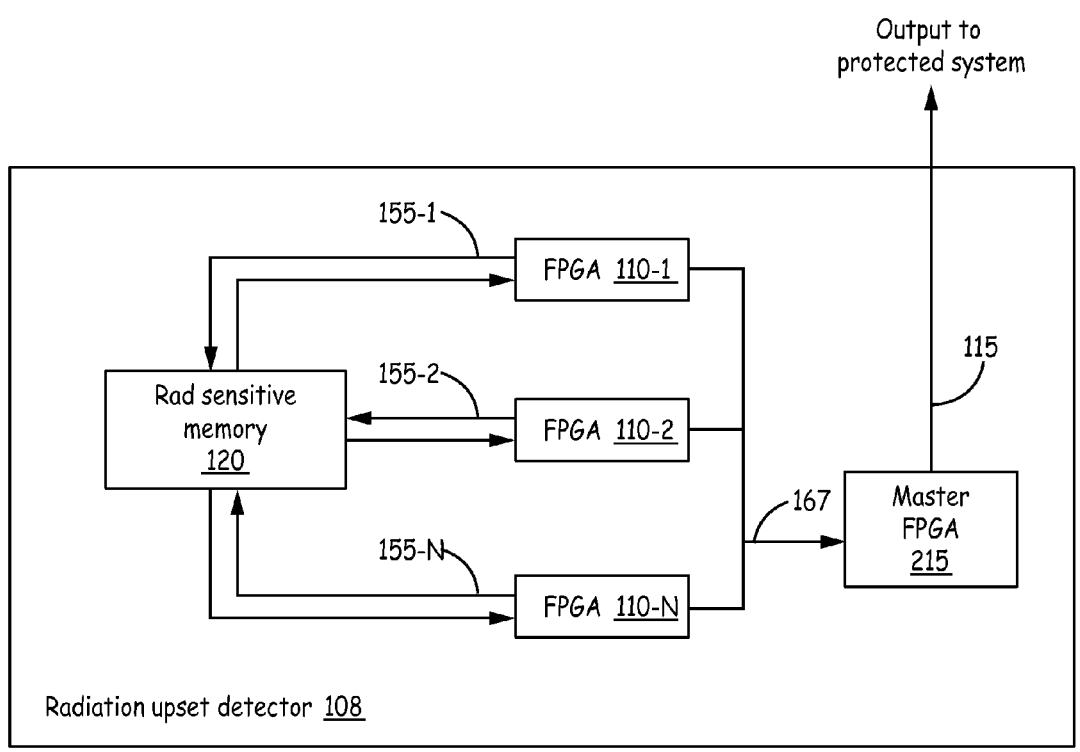

FIG. 8 shows an embodiment of a radiation upset detector 108 configured to output an action command 115 to the protected system (e.g., protected system 50) in accordance with the present application. FIG. 8 differs from FIG. 7 in that a plurality of FPGA's checks a single memory. There is a master FPGA 215 in the radiation upset detector 107.

The master FPGA 215 is similar in structure and function to the master FPGA 215 of FIG. 4. The master FPGA 215 is communicatively coupled to the FPGA 110(1-N) to accept one or more signals 167 indicative of an error in one of the radiation sensitive memories 120(1-K). The master FPGA 215, upon accepting a signal 167 from at least one of the FPGA 110, FPGA 111, and FPGA 112, is communicatively coupled to the protected system to send an action command 115 to the protected system, which, in one implementation, initiates a reset in at least one component in the protected system.

The embodiments of radiation upset detectors described herein permit early detection of a radiation environment so mitigation measures are taken prior to the performance of a protected system being significantly degraded.

Example Embodiments

Example 1 includes a radiation upset detector for use with a protected system, the radiation upset detector comprising: at least one radiation sensitive memory initialized with at least one respective known-signature word; and at least one radiation hardened logic circuitry communicatively coupled to exchange data with the at least one respective radiation sensitive memory in order to check the at least one known-signature word at at least a kHz rate to detects errors, wherein at least a portion of the at least one radiation hardened logic circuitry is radiation hardened to withstand radiation events, wherein responsive to detecting an error in the known-signature word in the respective at least one radiation sensitive memory, the at least one radiation hardened logic circuitry is further configured to send an action command, and wherein at least one of: a memory size of the at least one radiation sensitive memory; a number of circuits in the at least one radiation hardened logic circuitry; a clock rate for the checking the at least one known-signature word; and at least one corruption threshold is selected based on system reliability requirements of the protected system including at least one of: an overall operational reliability requirement of the protected system; a probability of detection success; false alarm rates; and a required speed of detection.

Example 2 includes the radiation upset detector of Example 1, wherein the action command sent from the at least one radiation hardened logic circuitry is a command to re-initialize the respective at least one radiation sensitive memory.

Example 3 includes the radiation upset detector of any of Examples 1-2, wherein the action command sent from the at least one radiation hardened logic circuitry is a command to initiate a reset in at least one component in the protected system communicatively coupled to the at least one radiation hardened logic circuitry.

Example 4 includes the radiation upset detector of any of Examples 1-3, wherein the at least one radiation sensitive memory is a single radiation sensitive memory, wherein the at least one radiation hardened logic circuitry includes a plurality of radiation hardened logic circuitry.

Example 5 includes the radiation upset detector of Example 4, further comprising: master radiation hardened logic circuitry, wherein at least one of the plurality of radiation hardened logic circuitry sends at least one signal responsive to detecting the error in the known-signature word to the master radiation hardened logic circuitry, and wherein the master radiation hardened logic circuitry outputs the action command responsive to the at least one signal from the at least one of the plurality of radiation hardened logic circuitry.

Example 6 includes the radiation upset detector of any of Examples 4-5, wherein a subset of the plurality of radiation hardened logic circuitry is communicatively coupled to send at least one signal to one of the other radiation hardened logic circuitry in the plurality of radiation hardened logic circuitry, and wherein the one of the other radiation hardened logic circuitry outputs the action command responsive to the at least one signal from the subset of the plurality of radiation hardened logic circuitry.

Example 7 includes the radiation upset detector of any of Examples 4-6, wherein a first radiation hardened logic circuitry of the plurality of radiation hardened logic circuitry checks a first-known-signature word at at least a kHz rate in a first portion of the single radiation sensitive memory, and wherein a second radiation hardened logic circuitry of the plurality of radiation hardened logic circuitry checks a second-known-signature word at at least a kHz rate in a second portion of the single radiation sensitive memory.

Example 8 includes the radiation upset detector of any of Examples 1-7, wherein the at least one radiation hardened logic circuitry detects a first type of error of based on exceeding a first corruption threshold, wherein the action command sent from the at least one radiation hardened logic circuitry responsive to detecting the first type of error includes a command to initiate a reset in at least one component in the protected system communicatively coupled to the at least one radiation hardened logic circuitry and includes a command to re-initialize the respective at least one radiation sensitive memory.

Example 9 includes the radiation upset detector of any of Examples 1-8, wherein the at least one radiation hardened logic circuitry detects a second type of error based on data corruption being less than a first corruption threshold and exceeding a second corruption threshold.

Example 10 includes the radiation upset detector of Example 9, wherein the action command sent from the at least one radiation hardened logic circuitry responsive to detecting the second type of error is a command to re-initialize the respective at least one radiation sensitive memory.

Example 11 includes a method to protect a protected system from a radiation event, the method comprising: initializing at least one radiation sensitive memory with at least one known-signature word; checking the at least one known-signature word in the at least one radiation sensitive memory for errors in at least one radiation hardened logic circuitry at at least a kHz rate; detecting an error in the at least one known-signature word in the respective at least one radiation hardened logic circuitry; and sending an action command responsive to detecting the error, wherein at least one of: a memory size of the at least one radiation sensitive memory; a number of circuits in the at least one radiation hardened logic circuitry; a clock rate for the checking the at least one known-signature word; and at least one corruption threshold is selected based on system reliability requirements of the protected system including at least one of: an overall operational reliability requirement of the protected system; a probability of detection success; false alarm rates; and a required speed of detection.

Example 12 includes the method of Example 11, wherein sending the action command responsive to detecting the error comprises: sending a re-initialization signal to re-initialize the respective at least one radiation sensitive memory from the at least one radiation hardened logic circuitry to re-initialize at least a portion of the protected system based on a detection of the error.

Example 13 includes the method of Example 12, wherein sending the action command responsive to detecting the error comprises: sending a reset signal to initiate a reset in at least one component in the protected system communicatively coupled to the at least one radiation hardened logic circuitry.

Example 14 includes the method of any of Examples 11-13, wherein sending the action command responsive to detecting the error comprises: sending a reset signal to initiate a reset in at least one component in the protected system communicatively coupled to the at least one radiation hardened logic circuitry.

Example 15 includes the method of any of Examples 11-14, wherein initializing at least one radiation sensitive memory with at least one known-signature word comprises: initializing a first radiation sensitive memory with a first-known-signature word; and initializing a second radiation sensitive memory with a second-known-signature word, wherein checking the at least one known-signature word in the radiation sensitive memory for errors in at least one radiation hardened logic circuitry comprises: checking the first-known-signature word in the first radiation sensitive memory for errors in first logic circuitry at at least a kHz rate; and checking the second-known-signature word in the second radiation sensitive memory for errors in second logic circuitry at at least a kHz rate.

Example 16 includes the method of any of Examples 11-15, wherein initializing at least one radiation sensitive memory with at least one known-signature word comprises: initializing a single radiation sensitive memory with a first-known-signature word and with a second-known-signature word, wherein checking the at least one known-signature word in the radiation sensitive memory for errors in at least one radiation hardened logic circuitry comprises: checking the first-known-signature word in the single radiation sensitive memory for errors in first logic circuitry; and checking the second-known-signature word in the single radiation sensitive memory for errors in second logic circuitry.

Example 17 includes a protected sensor system comprising: a hardened storage; a protected system communicatively coupled to the hardened storage; at least one sensor; and a radiation upset detector communicatively coupled to the protected system, the radiation upset detector including: at least one radiation sensitive memory initialized with at least one respective known-signature word; and at least one radiation hardened logic circuitry communicatively coupled to exchange data with at least one respective radiation sensitive memory in order to check the at least one known-signature word at at least a kHz rate to detects errors, wherein at least a portion of the at least one radiation hardened logic circuitry is radiation hardened to withstand radiation events, wherein responsive to detecting an error in the known-signature word in the respective at least one radiation sensitive memory, the at least one radiation hardened logic circuitry is further configured to send an action command, and wherein at least one of: a memory size of the at least one radiation sensitive memory; a number of circuits in the at least one radiation hardened logic circuitry; a clock rate for the checking the at least one known-signature word; and at least one corruption threshold is selected based on system reliability requirements of the protected system including at least one of: an overall operational reliability requirement of the protected system; a probability of detection success; false alarm rates; and a required speed of detection.

Example 18 includes the protected sensor system of Example 17, wherein the action command sent from the at least one radiation hardened logic circuitry is a command to re-initialize the respective at least one radiation sensitive memory.

Example 19 includes the protected sensor system of any of Examples 17-18, wherein the action command sent from the at least one radiation hardened logic circuitry is a command to initiate a reset in at least one component in the protected system communicatively coupled to the at least one radiation hardened logic circuitry when the error is detected.

Example 20 includes the protected sensor system of Example 19, wherein the at least one radiation hardened logic circuitry includes a plurality of radiation hardened logic circuitry, and wherein the radiation upset detector further comprises: master radiation hardened logic circuitry, wherein at least one of the plurality of radiation hardened logic circuitry sends a signal responsive to detecting the error in the known-signature word to the master radiation hardened logic circuitry, wherein the master radiation hardened logic circuitry outputs the an action command to initiate the reset in the at least one component in the protected system.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A radiation upset detector for use with a protected system, the radiation upset detector comprising:
at least one radiation sensitive memory initialized with at least one respective known-signature word; and
at least one radiation hardened logic circuitry communicatively coupled to exchange data with the at least one respective radiation sensitive memory in order to check the at least one known-signature word at at least a kHz rate to detect errors,
wherein at least a portion of the at least one radiation hardened logic circuitry is radiation hardened to withstand radiation events,
wherein responsive to detecting an error in the known-signature word in the respective at least one radiation sensitive memory, the at least one radiation hardened logic circuitry is further configured to send an action command, and
wherein a memory size of the at least one radiation sensitive memory; a number of circuits in the at least one radiation hardened logic circuitry; a clock rate for the checking the at least one known-signature word; and at least one corruption threshold are selected based on system reliability requirements of the protected system including at least one of:
an overall operational reliability requirement of the protected system; a probability of detection success; false alarm rates; and a required speed of detection.

2. The radiation upset detector of claim 1, wherein the action command sent from the at least one radiation hardened logic circuitry is a command to re-initialize the respective at least one radiation sensitive memory.

3. The radiation upset detector of claim 1, wherein the action command sent from the at least one radiation hardened logic circuitry is a command to initiate a reset in at least one component in the protected system communicatively coupled to the at least one radiation hardened logic circuitry.

4. The radiation upset detector of claim 1, wherein the at least one radiation sensitive memory is a single radiation sensitive memory, wherein the at least one radiation hardened logic circuitry includes a plurality of radiation hardened logic circuitry.

5. The radiation upset detector of claim 4, further comprising:
master radiation hardened logic circuitry, wherein at least one of the plurality of radiation hardened logic circuitry sends at least one signal responsive to detecting the error in the known-signature word to the master radiation hardened logic circuitry, and wherein the master radiation hardened logic circuitry outputs the action command responsive to the at least one signal from the at least one of the plurality of radiation hardened logic circuitry.

6. The radiation upset detector of claim 4, wherein a subset of the plurality of radiation hardened logic circuitry is communicatively coupled to send at least one signal to one of the other radiation hardened logic circuitry in the plurality of radiation hardened logic circuitry, and wherein the one of the other radiation hardened logic circuitry outputs the action command responsive to the at least one signal from the subset of the plurality of radiation hardened logic circuitry.

7. The radiation upset detector of claim 4, wherein a first radiation hardened logic circuitry of the plurality of radiation hardened logic circuitry checks a first-known-signature word at at least a kHz rate in a first portion of the single radiation sensitive memory, and wherein a second radiation hardened logic circuitry of the plurality of radiation hardened logic circuitry checks a second-known-signature word at at least a kHz rate in a second portion of the single radiation sensitive memory.

8. The radiation upset detector of claim 1, wherein the at least one radiation hardened logic circuitry detects a first type of error based on exceeding a first corruption threshold, wherein the action command sent from the at least one radiation hardened logic circuitry responsive to detecting the first type of error includes a command to initiate a reset in at least one component in the protected system communicatively coupled to the at least one radiation hardened logic circuitry and includes a command to re-initialize the respective at least one radiation sensitive memory.

9. The radiation upset detector of claim 1, wherein the at least one radiation hardened logic circuitry detects a second type of error based on data corruption being less than a first corruption threshold and exceeding a second corruption threshold.

10. The radiation upset detector of claim 9, wherein the action command sent from the at least one radiation hardened logic circuitry responsive to detecting the second type of error is a command to re-initialize the respective at least one radiation sensitive memory.

11. A method to protect a protected system from a radiation event, the method comprising:
  initializing at least one radiation sensitive memory with at least one known-signature word;
  checking the at least one known-signature word in the at least one radiation sensitive memory for errors in at least one radiation hardened logic circuitry at at least a kHz rate;
  detecting an error in the at least one known-signature word in the respective at least one radiation hardened logic circuitry; and
  sending an action command responsive to detecting the error,
  wherein a memory size of the at least one radiation sensitive memory; a number of circuits in the at least one radiation hardened logic circuitry; a clock rate for the checking the at least one known-signature word; and at least one corruption threshold are selected based on system reliability requirements of the protected system including at least one of:
  an overall operational reliability requirement of the protected system; a probability of detection success; false alarm rates; and a required speed of detection.

12. The method of claim 11, wherein sending the action command responsive to detecting the error comprises:
  sending a re-initialization signal to re-initialize the respective at least one radiation sensitive memory from the at least one radiation hardened logic circuitry to re-initialize at least a portion of the protected system based on a detection of the error.

13. The method of claim 12, wherein sending the action command responsive to detecting the error comprises:
  sending a reset signal to initiate a reset in at least one component in the protected system communicatively coupled to the at least one radiation hardened logic circuitry.

14. The method of claim 11, wherein sending the action command responsive to detecting the error comprises:
  sending a reset signal to initiate a reset in at least one component in the protected system communicatively coupled to the at least one radiation hardened logic circuitry.

15. The method of claim 11, wherein initializing the at least one radiation sensitive memory with the at least one known-signature word comprises:
  initializing a first radiation sensitive memory with a first-known-signature word; and
  initializing a second radiation sensitive memory with a second-known-signature word, wherein checking the at least one known-signature word in the radiation sensitive memory for errors in the at least one radiation hardened logic circuitry comprises:
  checking the first-known-signature word in the first radiation sensitive memory for errors in first logic circuitry at at least a kHz rate; and
  checking the second-known-signature word in the second radiation sensitive memory for errors in second logic circuitry at at least a kHz rate.

16. The method of claim 11, wherein initializing the at least one radiation sensitive memory with the at least one known-signature word comprises:
  initializing a single radiation sensitive memory with a first-known-signature word and with a second-known-signature word, wherein checking the at least one known-signature word in the radiation sensitive memory for errors in the at least one radiation hardened logic circuitry comprises:
  checking the first-known-signature word in the single radiation sensitive memory for errors in first logic circuitry; and
  checking the second-known-signature word in the single radiation sensitive memory for errors in second logic circuitry.

17. A protected sensor system comprising:
  a hardened storage;
  a protected system communicatively coupled to the hardened storage;
  at least one sensor; and
  a radiation upset detector communicatively coupled to the protected system, the radiation upset detector including:
    at least one radiation sensitive memory initialized with at least one respective known-signature word; and
    at least one radiation hardened logic circuitry communicatively coupled to exchange data with at least one respective radiation sensitive memory in order to check the at least one known-signature word at at least a kHz rate to detect errors,
  wherein at least a portion of the at least one radiation hardened logic circuitry is radiation hardened to withstand radiation events, wherein responsive to detecting an error in the known-signature word in the respective at least one radiation sensitive memory, the at least one radiation hardened logic circuitry is further configured to send an action command, and
  wherein a memory size of the at least one radiation sensitive memory; a number of circuits in the at least one radiation hardened logic circuitry; a clock rate for the checking the at least one known-signature word; and at least one corruption threshold are selected based on system reliability requirements of the protected system including at least one of:
  an overall operational reliability requirement of the protected system; a probability of detection success; false alarm rates; and a required speed of detection.

18. The protected sensor system of claim 17, wherein the action command sent from the at least one radiation hardened logic circuitry is a command to re-initialize the respective at least one radiation sensitive memory.

19. The protected sensor system of claim 17, wherein the action command sent from the at least one radiation hardened logic circuitry is a command to initiate a reset in at least one component in the protected system communicatively coupled to the at least one radiation hardened logic circuitry when the error is detected.

20. The protected sensor system of claim 19, wherein the at least one radiation hardened logic circuitry includes a plurality of radiation hardened logic circuitry, and wherein the radiation upset detector further comprises:
  master radiation hardened logic circuitry, wherein at least one of the plurality of radiation hardened logic circuitry sends a signal responsive to detecting the error in the known-signature word to the master radiation hardened logic circuitry, wherein the master radiation hardened logic circuitry outputs the action command to initiate the reset in the at least one component in the protected system.

* * * * *